(12) United States Patent
Chen et al.

(10) Patent No.: US 12,418,011 B2
(45) Date of Patent: Sep. 16, 2025

(54) BONDING AND TRANSFERRING METHOD FOR DIE PACKAGE STRUCTURES

(71) Applicant: Ingentec Corporation, Miaoli County (TW)

(72) Inventors: Hsiao Lu Chen, Zhunan Township (TW); Ai Sen Liu, Zhunan Township (TW); Hsiang An Feng, Zhunan Township (TW); Ya Li Chen, Zhunan Township (TW)

(73) Assignee: INGENTEC CORPORATION, Miaoli County (TW)

( * ) Notice: Subject to any disclaimer, the term of this patent is extended or adjusted under 35 U.S.C. 154(b) by 472 days.

(21) Appl. No.: 18/106,883

(22) Filed: Feb. 7, 2023

(65) Prior Publication Data
US 2024/0072033 A1    Feb. 29, 2024

(30) Foreign Application Priority Data
Aug. 31, 2022   (TW) .................................. 111133015

(51) Int. Cl.
*H01L 21/768*   (2006.01)
*H01L 23/00*   (2006.01)
*H01L 25/00*   (2006.01)

(52) U.S. Cl.
CPC ........ *H01L 25/50* (2013.01); *H01L 21/76877* (2013.01); *H01L 24/03* (2013.01); *H01L 2224/03005* (2013.01); *H01L 2224/03502* (2013.01); *H01L 2924/12041* (2013.01)

(58) Field of Classification Search
CPC .... H01L 25/50; H01L 21/76877; H01L 24/03
See application file for complete search history.

(56) References Cited

U.S. PATENT DOCUMENTS

| | | | |
|---|---|---|---|
| 9,966,325 B2 * | 5/2018 | Beyne | H01L 25/50 |
| 2018/0211992 A1 * | 7/2018 | Bedell | H10H 29/142 |
| 2022/0165584 A1 * | 5/2022 | Kim | H01L 21/568 |

* cited by examiner

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A bonding and transferring method for die package structures is provided, including providing a die package structure which has a positioning adhesive disposed thereon, and providing a vibration base having at least one cavity corresponding to the positioning adhesive. By alignment of the positioning adhesive and the cavity, the die package structure can be positioned into the vibration base. A target substrate is further provided and bonded with the vibration base having the die package structure disposed thereon through a metal material. And a laser process is then performed to melt the metal material. At last, the vibration base and the positioning adhesive are removed so the die package structure is successfully bonded and transferred onto the target substrate. By employing the proposed process method of the present invention, rapid mass transfer result is accomplished, and the packaging yield of vertical light emitting diode die package structures is optimized.

15 Claims, 9 Drawing Sheets

BONDING AND TRANSFERRING METHOD FOR DIE PACKAGE STRUCTURES

This application claims priority of application Ser. No. 11/133,015 filed in Taiwan on 31 Aug. 2022 under 35 U.S.C. § 119; the entire contents of all of which are hereby incorporated by reference.

BACKGROUND OF THE INVENTION

Field of the Invention

The present invention relates to a bonding and transferring technology for vertical light emitting diode (LED) die package structures. More particularly, the present invention is related to a bonding and transferring process method which is aimed to directly transfer a great number of vertical light emitting diode (LED) die package structures in a mass transfer process.

DESCRIPTION OF THE PRIOR ART

In general, as known, a Light Emitting Diode (LED) is a certain kind of light source which is fabricated using the semiconductor technology and formed by III-V group compound semiconductors. The LEDs normally operate based on a fact that electrons are combined with holes in a semiconductor to produce photons. The LEDs are different from the conventional light bulbs which must work at a high temperature of thousands of degrees. The LEDs are also different from fluorescent lamps which must be using a high voltage to excite an electron beam. Just like a general electronic element, an LED simply requires a voltage of 2~4 V to operate and thus being able to work at a normal temperature environment. While compared with the traditional tungsten light bulbs, it is believed that LEDs are certainly advantageous of having longer lifetime, higher luminous efficiency, lower failure rate, saving more power, and giving much more stable light. Also, the LEDs are highly compatible with various types of lamp devices. As a result, it is believed that the luminous life of LEDs is certainly to be much longer than that of the traditional light sources, thereby making the LEDs has successfully become a mainstream commodity in the market nowadays.

Normally, the LED die structures overall, mainly comprise a horizontal structure and a vertical structure. Regarding a vertical-structure LED, when compared with the horizontal-structure LED, it is believed that the vertical-structure LED is able to provide better reliability in terms of structural strength, photoelectric parameters, thermal characteristics, light decay and cost, etc. And therefore, the vertical-structure LED has been widely used in the industry nowadays.

As the science and technologies improve, these vertical-structure LED dies are gradually being mass transferred onto a variety of electronic devices and their substrates thereof. So far, there has been a few conventional techniques, which have been disclosed in the prior arts regarding transferring the die to the substrate, including: SMT (Surface Mount Technology), wafer-to-wafer transfer technology, electrostatic transfer technology, and so on. Regarding the Surface Mount Technology (SMT), it is known that, each of the dies has to be packaged into a SMD (Surface Mount Device) first in the surface mount technology. And a surface mount machine is employed to use a vacuum nozzle for absorbing and placing these SMD components, one by one onto the circuit board. After that, the SMD components are fixed on the substrate through a reflow furnace. However, the surface mount technology can only transfer a single die at one time. When a mass transfer of the dies is required by the industries, the surface mount technology is not sufficient to use.

While considering the wafer-to-wafer transfer technology, then, an original substrate of the die must be attached to a target substrate, and then the original substrate is peeled off, so as to transfer the die to the target substrate. However, such transferring method demands strict requirements on both sizes of the original substrate and the target substrate. Meanwhile, the spacing of each die to be transferred has to be consistent as well. Owing to these strict requirements and restrictions, the wafer-to-wafer transfer technology application is obviously restricted. As for the electrostatic transfer technology, dies must be electrostatically picked, transferred, and placed on the target substrate. And therefore, it is very likely to damage the die structure, and since hardware contact is always generated during the transfer process, it is also very easy to damage the substrate. In addition, such transferring technology is limited by the size of its electrostatic electrode as well.

Moreover, when the die structure is transferred onto the target substrate, the die alignment is quite difficult to control and thus can not be accurate even if it was performed by a well-trained human operation or sophisticated transfer technology. And an inaccurate die alignment affects the difficulty and increases the complexity to fix the die in the right position subsequently and may even increase the cost and time for rework.

Therefore, on account of above, to overcome the above-mentioned problems, it should be obvious that there is indeed an urgent need for the professionals in the field for a novel and inventive process method to be developed that can effectively solve the above-mentioned problems occurring in the prior techniques, so as to optimize the efficiency for mass transferring the light emitting diode dies in a modified manner.

As a result, the Applicants of the present invention observe the above deficiencies to be improved, and thus propose a novel bonding and transferring method for vertical light emitting diode die package structures. Through the disclosed innovative bonding and transferring process method, the LED die package structures can be mass transferred in an optimal result and superior benefits. Hereinafter, the detailed specific implementations will be fully described in the following paragraphs.

SUMMARY OF THE INVENTION

In order to overcome the above-mentioned disadvantages, one major objective in accordance with the present invention is provided for a novel bonding and transferring method for die package structures. The disclosed bonding and transferring method can be applied to the transfer process of vertical light emitting diode dies, and furthermore, can even be applied to its mass-transfer process when a great number of vertical light emitting diode dies are expected to be transferred. Therefore, the present invention achieves in meeting the mass-transfer technical requirements of the related industries in a rapid and optimal efficiency.

It is noted that the disclosed process method and its performing steps are not limited to the mass-transfer process of vertical light emitting diode dies. According to the technical contents provided by the present invention, the disclosed process method may alternatively be applied to any mass-transfer process of various crystal dies or grains. Many alternatives and modifications will be apparent to those skilled in the art, once informed by the present disclosure, and thus still fall into the claim scope of the present invention. By adopting the technical contents of the present invention, the conventional process steps and process cost of the mass-transfer process for die package structures can be effectively reduced, and at the same time, no damages will be formed to the die package structure. The packaging yield of light emitting diode die structures is thus believed to be optimized.

And moreover, another major objective in accordance with the present invention is to provide for a process method for vertical light emitting diode die package structures. The proposed process method is aimed to directly perform a plurality of aligning, soldering, and transferring the die package structures onto a target substrate in a die-package level. Since the present invention is able to perform the process method directly upon the package structures, the traditional alignment and wire-soldering process when flip-chip bonding was required in the conventional methodology can be omitted. Therefore, it is believed that the present invention is advantageous of saving the cost of time-consuming and labor-intensive operations as required in the prior arts, thereby complying with the needs of the industries for rapid and massive transfer.

For achieving the above-mentioned objectives, the proposed bonding and transferring method for die package structures in accordance with the embodiment of the present invention includes a plurality of following steps: providing a die package structure first, and disposing a positioning adhesive on the die package structure; then providing a vibration base, which includes at least one cavity corresponding to the positioning adhesive such that the cavity accommodates the positioning adhesive; and then spraying the die package structure and vibrating the vibration base, such that the die package structure can be disposed into the vibration base due to an alignment of the positioning adhesive and the cavity. On the other hand, a target substrate is also provided, and the target substrate includes a plurality of drill hole, wherein the plurality of drill hole is filled with a first metal material and a second metal material is further provided to coat on an upper surface of the plurality of drill hole. And therefore, the second metal material can be subsequently used for bonding the target substrate with the vibration base having the die package structure thereon. And then, a laser process is performed so as to melt the second metal material, such that the target substrate and the die package structure are jointly bonded. At last, the vibration base is removed, and an adhesive removal process is performed such that the positioning adhesive can be removed. As a result, the die package structure is successfully bonded and transferred onto the target substrate.

According to the embodiment of the present invention, the positioning adhesive preferably can be made of UV curable water glue. Under such circumstances, a deionized water can be easily adopted to hydrolyze the UV curable water glue, such that the UV curable water glue (the positioning adhesive) can be effectively removed. In one applicable embodiment, a process time of the adhesive removal process, for instance, is between 20 minutes and 40 minutes. And a process temperature of the adhesive removal process is approximately between 60° C. and 90° C.

On the other hand, regarding the target substrate used in the present invention, the material of the target substrate can be preferably made of glass. And a hole diameter of its drill hole disposed therein can be, for instance, approximately, at least 60 μm. Moreover, the first metal material (for instance, copper) can be filled in the plurality of drill hole through a screen printing process or an electroplating process. And the second metal material (for instance, tin) can be further provided to coat on the upper surface of the plurality of drill hole through a screen printing process or a jet printing process. Under such circumstances, a temperature up to 240~265 Celsius degrees as well as a laser time for 0.3~3.0 seconds are required for performing the above-mentioned laser process, in order to melt the tin material (the second metal material), such that the target substrate and the die package structure can be jointly bonded together.

In another aspect of the present invention, for achieving a much more accurate alignment result of the positioning adhesive on the die package structure and the cavity of the vibration base, according to one preferred embodiment of the present invention, a magnetic material can be further provided to coat on an outer region of the positioning adhesive, and the cavity corresponding to the positioning adhesive is designed as a magnetic cavity. In other words, according to such an embodiment, the magnetic cavity is a cavity which has magnetism, and can provide and generate magnetic attraction. As set forth, by such configurations, it is guaranteed that the alignment of the positioning adhesive and the cavity can be further made by magnetic attraction between the magnetic material and the magnetic cavity for forming an even more accurate and precise alignment result. To be specific, in such a preferred embodiment, the magnetic material used, can be preferably made of magnetic powder resin.

Therefore, according to the above-mentioned process steps and transferring method disclosed by the present invention, when there will be a plurality cavity designed in the vibration base, then the present invention is able to perform the above-mentioned process steps for bonding a great quantity of die package structures to the vibration base having a plurality cavity, and then transferring the plenty of die package structures onto the target substrate. In view of the technical solution provided by the present invention, it is believed that the present invention can successfully meet the needs of the current industry for rapid and efficient mass-transfer process. And at the same time, the die package structural yield of the current vertical light emitting diodes is getting optimized as well.

In addition, when employing the mass-transfer process method disclosed in the present invention and applying it to the vertical light emitting diode die transfer process, the vertical light emitting diode die to be transferred, for example, can be selected from a group consisting of a red light emitting diode die, a blue light emitting diode die and a green light emitting diode die. However, it should also be noted that the present invention is certainly not limited to such wavelength range of light emitting diode dies (emitting red, blue or green lights). According to variant embodiments of the invention, the vertical light emitting diode dies may also be composed as LED dies having various colors, or LED dies which emit white lights (visible lights) according to different preset wavelength bands. As a result, it is believed that the technical solutions disclosed in the present invention can be further widely applied, and not limited by the disclosed embodiment of the present invention.

As a result, it should be apparent that when those skilled in the art are familiar with the technical solutions disclosed in the present invention and adopt the proposed bonding and transferring method for die package structures, it successfully eliminates the existing issues and deficiencies in the current technologies. Therefore, it can be obvious that the present invention is provided to effectively reduce the excessive cost and process steps in the existing mass-transfer process. As such, when compared to the current existing technologies, the present invention is certainly characterized by not only having great industrial applicability and technical competitiveness, but also being widely applied in any other related technical fields for mass-transfer processes and optimizing its process yield.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
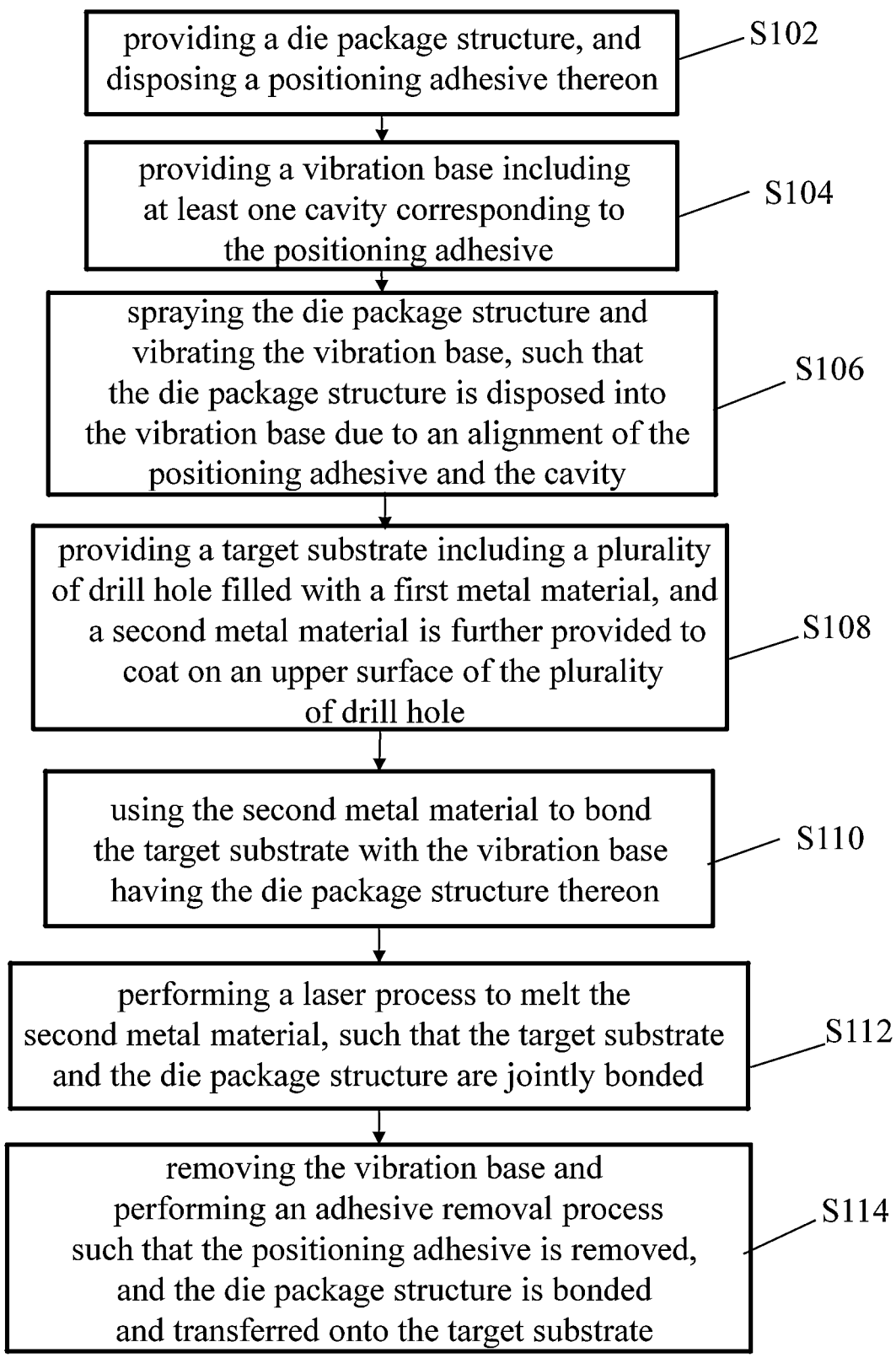
FIG. 1 shows a process flow chart illustrating the steps of the proposed bonding and transferring method for die package structures in accordance with one embodiment of the present invention.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the following paragraphs, the present invention is aimed to provide a bonding and transferring method for package structures of vertical light emitting diode (LED) dies. The disclosed process method can be applied to the current existing vertical LED die package structures and directly perform the package-level structure transferring in a mass transfer need, such that the mass-transfer efficiency of the LED die package structures can be optimized. Moreover, in a further aspect, the disclosed bonding and transferring method for vertical light emitting diode (LED) die package structures proposed in the present invention may also be widely applied to related alternative technical fields, whereby it is believed that the present invention is not limited thereto the following embodiments.

Please refer to FIG. 1, which shows a process flow chart illustrating the steps of the proposed bonding and transferring method for die package structures in accordance with one embodiment of the present invention. According to the disclosed process method, the bonding and transferring method of the present invention includes a plurality of following steps: S102: First, a die package structure is provided, and a positioning adhesive is disposed on the die package structure. S104: Subsequently, a vibration base is provided, and the vibration base includes at least one cavity corresponding to the positioning adhesive such that the cavity accommodates the positioning adhesive. S106: the present invention proposes to spray the die package structure and vibrate the vibration base, such that the die package structure is disposed into the vibration base due to an alignment of the positioning adhesive and the cavity. S108: And then, a target substrate which includes a plurality of drill hole is provided, wherein the plurality of drill hole is filled with a first metal material, and a second metal material is further provided to coat on an upper surface of the plurality of drill hole. S110: As a result, the present invention is able to use the second metal material to bond the target substrate with the vibration base having the die package structure thereon. And in the step of S112: a laser process is subsequently performed in order to melt the above-mentioned second metal material, such that the target substrate and the die package structure can be jointly bonded. And in the step of S114: the present invention performs to remove the foregoing vibration base and subsequently performs an adhesive removal process such that the positioning adhesive is removed. As a result, the die package structure is successfully bonded and transferred onto the target substrate by employing the disclosed process method of the present invention.

To be more specific and for better understandings of the process method disclosed in the present invention, please follow the schematic diagrams and element symbols as illustrated in FIG. 2 to FIG. 10 of the present invention for the detailed descriptions in the following paragraphs.

Figure 2:
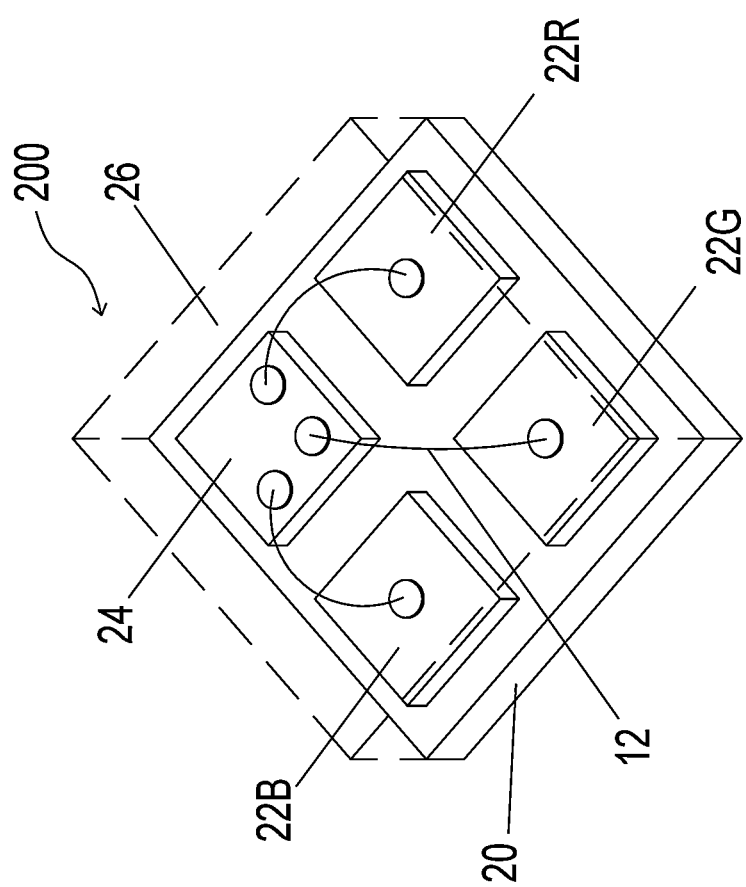
FIG. 2 schematically shows a structural diagram of a die package structure in accordance with one embodiment of the present invention.

First, please refer to FIG. 2, which shows a structural diagram of a die package structure in accordance with one embodiment of the present invention. According to the embodiment of the present invention, as shown in FIG. 2, the die package structure 200, for instance, can be a package structure of a vertical light emitting diode die. And the vertical light emitting diode die can be alternatively selected from a group consisting of a red light emitting diode die 22R, a blue light emitting diode die 22B and a green light emitting diode die 22G. According to FIG. 2, each of the red light emitting diode die 22R, the blue light emitting diode die 22B and the green light emitting diode die 22G is electrically connected to an upper electrode 24 through a solder wire 12. A carrier substrate 20 is used to accommodate the red light emitting diode die 22R, the blue light emitting diode die 22B, the green light emitting diode die 22G and the upper electrode 24. An encapsulant 26 is further provided to cover the above-mentioned red light emitting diode die 22R, blue light emitting diode die 22B, green light emitting diode die 22G and the upper electrode 24 for encapsulation and forming the die package structure 200. In one embodiment, a material of the carrier substrate 20, for example, can be a commonly used resin. And the encapsulant 26 used, for example, can be made of silicone or epoxy. And yet, in a further aspect of the invention, in order to increase the visual contrast effect after encapsulation, the encapsulant 26, preferably, can also be used as a color of black silicone or black epoxy. It should be noted hereinafter that, the vertical light emitting diode dies mentioned in the present invention are not limited to being composed of the above-mentioned red, blue, or green LED dies. In other alternative embodiments of the present invention, the vertical light emitting diode dies may also comprise light emitting diode dies of non-pure colors. Moreover, regarding the number of red, blue, and green light emitting diode dies, or their configuration arrangement patterns (for example, the arrangement is in an L-shaped pattern in this embodiment, or it may also be arranged in a straight line in other embodiments), the present invention is also not limited thereto by the illustrative embodiments. The main spirit of the invention lies in that, a sole die package structure 200 can be directly mass-transferred in a single process, without the need to transfer a single die one by one or repeatedly. By adopting the technical solution disclosed in the present invention, optimized efficiency and benefits for mass transfers are accomplished. As such, it should be obvious that the present invention is certainly not limited by the internal structure or components contained in any type of the die package structure 200.

Figure 3:
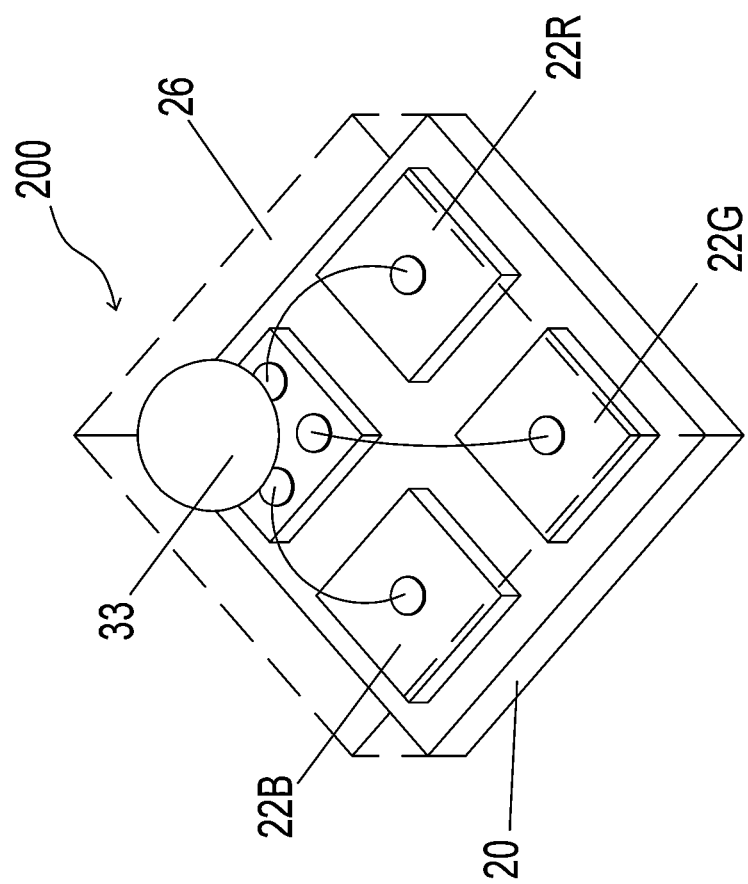
FIG. 3 schematically shows a structural diagram of a die package structure further comprising a positioning adhesive disposed thereon according to FIG. 2.
Figure 4:
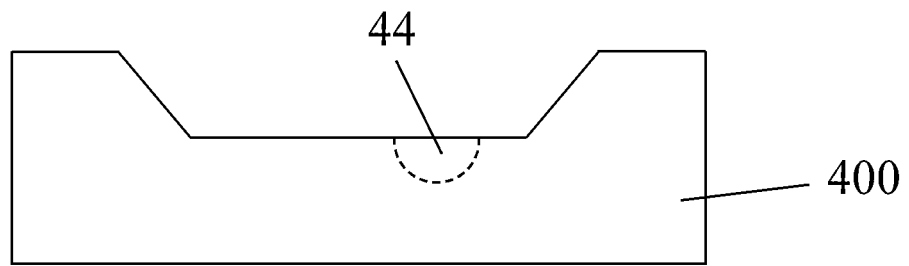
FIG. 4 schematically shows a cross sectional diagram of a vibration base which includes a cavity in accordance with the embodiment of the present invention.
Figure 5:
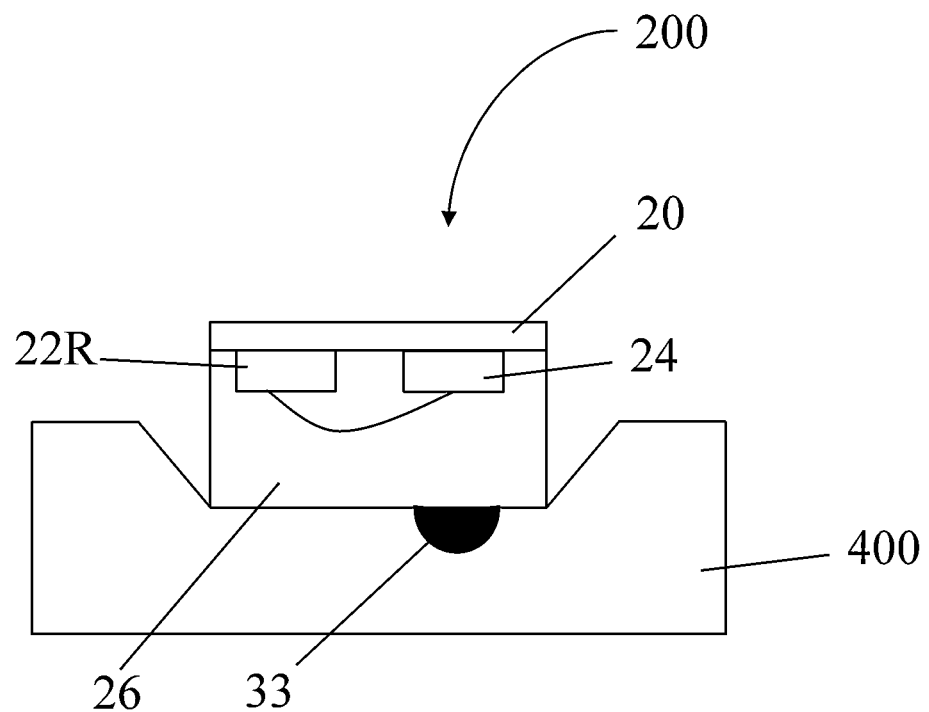
FIG. 5 schematically shows a cross sectional view of the die package structure being configured into the vibration base due to the alignment of the positioning adhesive and its corresponding cavity in accordance with the embodiment of the present invention.

Later, after examining and confirming the normal operation of the die package structure 200, as described in the step S102 in FIG. 1, the present invention provides a positioning adhesive on the die package structure 200. FIG. 3 shows an embodiment of the present invention, indicating the configuration of the positioning adhesive 33. For instance, the positioning adhesive 33 can be disposed at the corner of the die package structure 200, or at other identifiable or asymmetrical location (not in the center) of the die package structure 200. In general, those skilled in the art are allowed to make variations according to actual requirements or design specifications based on the technical features of the present invention.

And then, as described in the step S104 in FIG. 1, the present invention, on the other hand, provides a vibration base. Please refer to FIG. 4, which schematically shows a cross sectional diagram of a vibration base 400 in accordance with the embodiment of the present invention. As illustrated, the vibration base 400 includes at least one cavity 44, which is corresponding to the above-mentioned positioning adhesive 33. In other words, the physical outline, merit, size, shape and other parameters of the cavity 44 are designed corresponding to the positioning adhesive 33, such that the cavity 44 is used to be able to accommodate the positioning adhesive 33.

After that, as described in the step S106 in FIG. 1, the present invention proceeds to spray the above-mentioned die package structure 200 and also vibrate the vibration base 400, such that the die package structure 200 can be disposed and fixed into the vibration base 400 due to an alignment of the positioning adhesive 33 and the cavity 44. Please refer to FIG. 5, which schematically shows a cross sectional view of the die package structure 200 being configured into the vibration base 400 due to the alignment of the positioning adhesive 33 and its corresponding cavity in accordance with the embodiment of the present invention. As we can see, a solid semicircle is used to fill the cavity 44, for indicating that the positioning adhesive 33 is filled into the cavity 44 allegedly.

Figure 6:
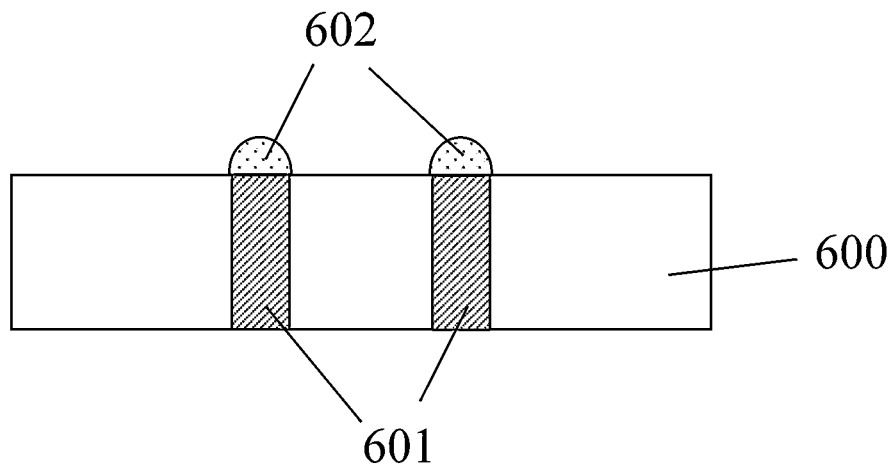
FIG. 6 schematically shows a cross sectional view of a target substrate used in accordance with the embodiment of the present invention.

On the other hand, please also refer to FIG. 6, which schematically shows a cross sectional view of a target substrate used in accordance with the embodiment of the present invention. As can be seen, a plurality of drill hole is formed in the target substrate 600. According to the embodiment of the present invention, the plurality of drill hole is filled with a first metal material 601. And a second metal material 602 is subsequently employed and coated on an upper surface of the plurality of drill hole. According to the embodiment of the present invention, the above-mentioned first metal material 601, for example, can be copper (Cu). And in the present invention, the copper can be filled into the plurality of drill hole through a screen printing process or an electroplating process. After that, the above-mentioned second metal material 602 can be applied and coated on the upper surface of the plurality of drill hole which has been filled with copper through a screen printing process or through a jet printing process. The above-mentioned second metal material 602, for example, can be tin (Sn). In general, the target substrate 600 used in the present invention can be, for example, a substrate made of glass. And a hole diameter of its drill hole disposed therein is approximately for instance, at least 60 µm. However, it should also be noted that these parameters are simply one illustrative embodiment of the present invention. For people who are skilled in the art and with ordinary knowledge in the field, modifications without departing from the spirit of the present invention are permitted. However, within the scope of its equality, it is believed that such modifications should still fall into the scope and claims of the present invention.

Figure 7:
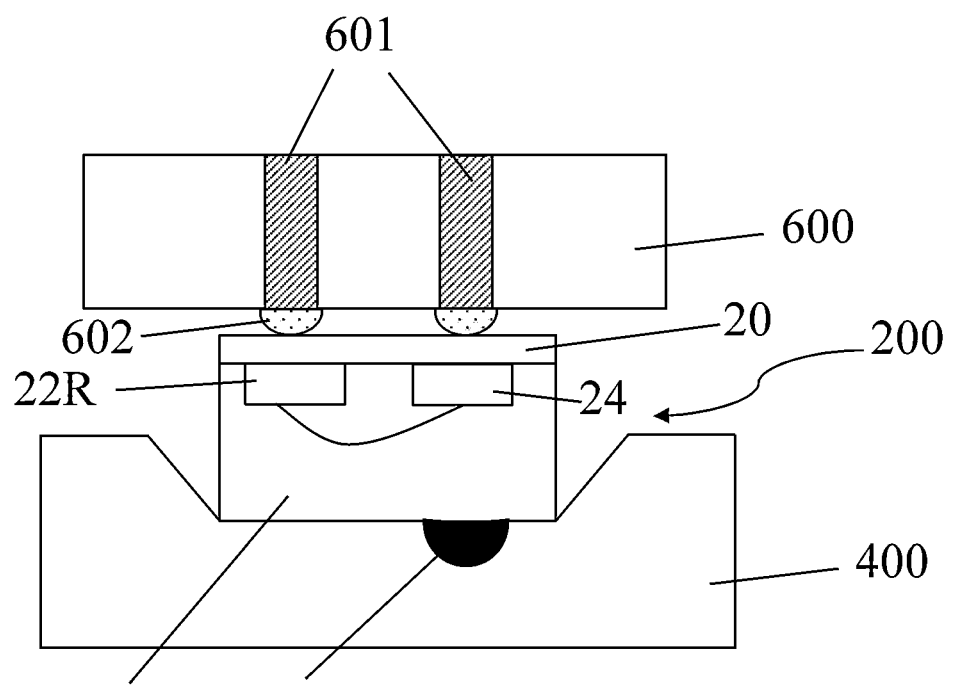
FIG. 7 shows a schematic diagram indicating that the target substrate and the vibration base having the die package structure thereon are bonded through the second metal material in accordance with the embodiment of the present invention.

As set forth, in the step of S108, the present invention is thus providing the target substrate 600, and in the step of S110 using the second metal material 602 to bond the target substrate 600 together with the vibration base 400 having the die package structure 200 thereon. As we can see, the schematic diagram showing that the target substrate 600 and the vibration base 400 are bonded is illustrated as shown in FIG. 7.

Figure 8:
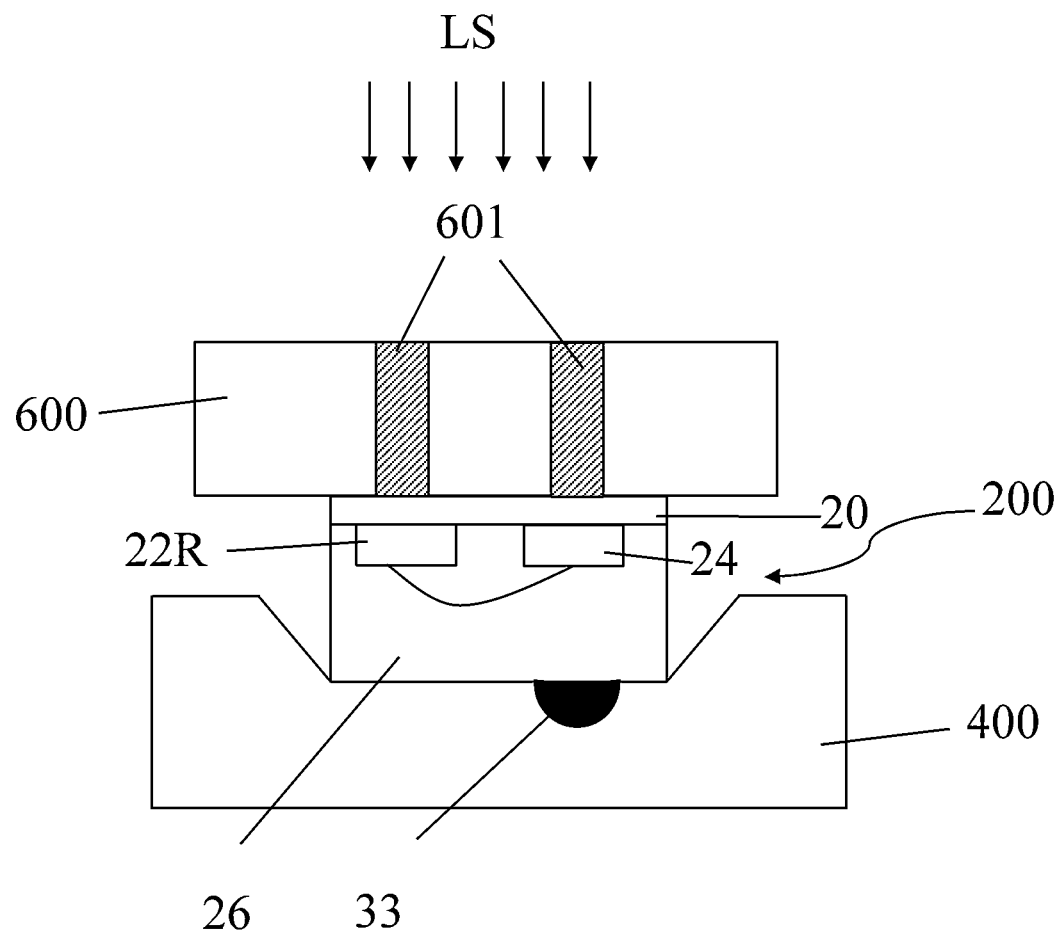
FIG. 8 shows a schematic diagram indicating that a laser process is employed and performed to melt the second metal material such that the target substrate and the die package structure are jointly bonded in accordance with the embodiment of the present invention.
Figure 9:
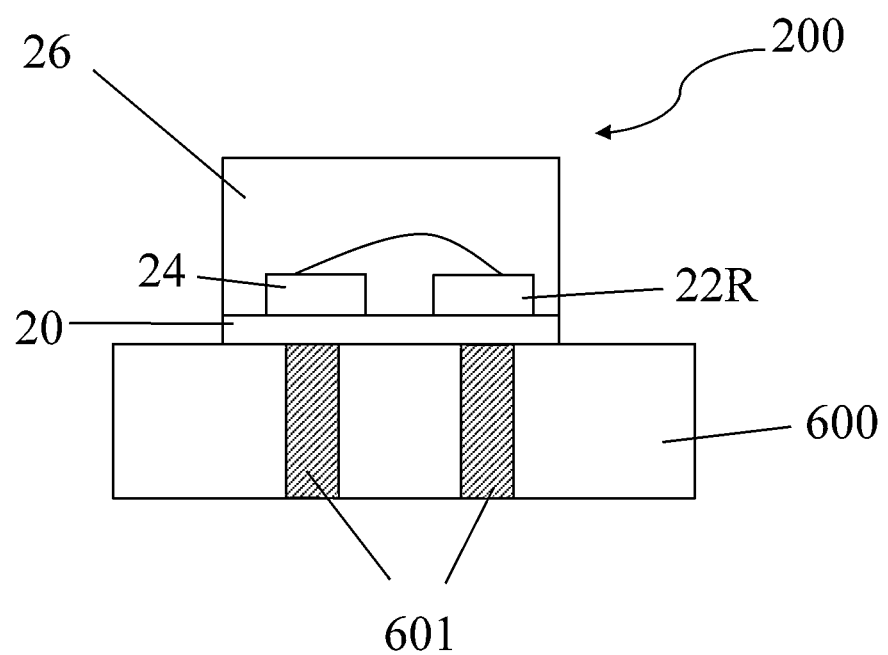
FIG. 9 shows a schematic diagram indicating that the die package structure is successfully bonded and transferred onto the target substrate after the vibration base and the positioning adhesive are removed in accordance with the embodiment of the present invention.
Figure 10:
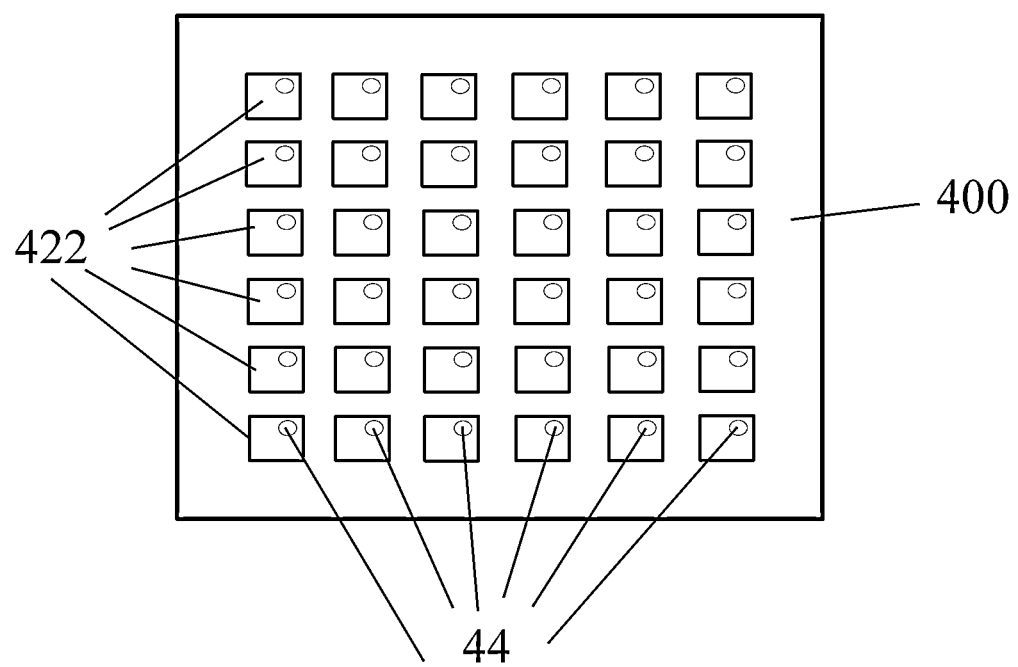
FIG. 10 shows a schematic diagram of a vibration base in which the vibration base includes a plurality of aligned mark and a plurality of cavity for mass-transferring a plurality of die package structure in accordance with another embodiment of the present invention.

Next, please refer to FIG. 8, in which a laser process LS is employed and performed to melt the foregoing second metal material 602. Under such a condition, after the second metal material 602 is melted, it is apparent that the target substrate 600 and the die package structure 200 are jointly bonded (as described in the step of S112). Specifically, according to one embodiment of the present invention, the laser process LS performed in the present invention is able to provide an instantaneous high temperature in an extremely short time. For example, based on the common knowledge and experiences, the temperature at which the tin material (the second metal material 602) can be melted is around 240~265 Celsius degrees. In particular, a laser time for performing the laser process LS is between 0.3 seconds and 3 seconds for the purpose of melting the tin material (the second metal material 602), such that the target substrate 600 and the die package structure 200 are jointly bonded.

As a result, after the target substrate 600 and the die package structure 200 are jointly bonded, the present invention proceeds to perform the step of S114 as described in FIG. 1, for removing the vibration base 400. In addition, an adhesive removal process will be performed such that the positioning adhesive 33 on the die package structure 200 can also be removed, and thus completing the process of bonding and transferring the die package structure 200 onto the target substrate 600. Please refer to FIG. 9 for a schematic diagram showing that the die package structure 200 is successfully bonded and transferred onto the target substrate 600.

Accordingly, based on the disclosed technical contents, the above-mentioned adhesive removal process should be determined according to the positioning adhesive 33 used in the present invention. In one preferred embodiment of the present invention, the positioning adhesive 33 used in the present invention, may be preferably made of UV curable water glue. As such, when the UV curable water glue is used as the positioning adhesive 33 in the present invention on the die package structure 200, it makes the "adhesive removal process" having relatively low complexity. For example, a deionized water can be easily adopted to hydrolyze the UV curable water glue, such that the UV curable water glue (the positioning adhesive) can be effectively removed. In details, a process time of the adhesive removal process is approximately between 20 minutes and 40 minutes, and a process temperature of the adhesive removal process is between 60° C. and 90° C. Based on the technical solution provided by the present invention, it is apparent that the present invention does not require to use any additional solvents or specific removal equipment for removing the positioning adhesive. Therefore, damages to the substrate and/or die package structure can be effectively reduced and even avoided. In addition, expensive cost and complex procedures for additional glue removal equipment may also be omitted. In view of the above-mentioned advantages, it is believed that the present invention succeeds in easily removing the positioning adhesive under the condition that low process complexity and no damages made to the substrate and/or die package structure are achieved. As a result, it is asserted that, these are also some major important inventive effects of the present invention.

And yet in another further aspect of the present invention, in the previously described steps S102~S106 when the positioning adhesive 33 and the cavity 44 of the vibration base 400 are aligned such that the die package structure 200 can be fixed into the vibration base 400, the present invention may alternatively provide a magnetic material on an outer region of the positioning adhesive 33, and meanwhile designs the cavity 44 corresponding to the positioning adhesive 33 to be a magnetic cavity. In other words, according to such an embodiment, the magnetic cavity is a cavity which has magnetism, and can provide and generate magnetic attraction. And under such a circumstance, the alignment of the positioning adhesive 33 and the cavity 44 can be further made by magnetic attraction between the magnetic material and the magnetic cavity in the vibration base 400. In one embodiment of the present invention, the magnetic material coating on the outer region of the positioning adhesive 33 of the die package structure 200 can be preferably made of magnetic powder resin, and such magnetic powder resin may also be easily removed along with the positioning adhesive 33 itself in the subsequent adhesive removal process without damaging the plain structure of the die package as earlier described.

And moreover, according to the disclosed bonding and transferring method for die package structures of the present invention, the process method may also be widely applied to mass-transfer of a great number of die package structures 200. In such a mass-transfer process, the vibration base further includes a plurality of the foregoing cavity, and these cavities can be used for accommodating a plurality of die package structures 200 to be transferred. For instance, please refer to FIG. 10, in which the vibration base 400 includes a plurality of aligned mark 422, and each of the aligned mark 422 is used for accommodation and alignment of a die package structure 200 to be disposed therein. Each of the aligned mark 422 includes a cavity 44, and by using the cavity 44 to accommodate the positioning adhesive of the die package structure 200, a great number of die package structures 200 can be bonded and transferred onto the target substrate by using the vibration base 400 which includes the plurality of cavity 44. As a result, it is apparent that the mass-transfer requirements in the related industry are fully complied and accomplished by adopting the disclosed process method of the present invention.

Figure 11:
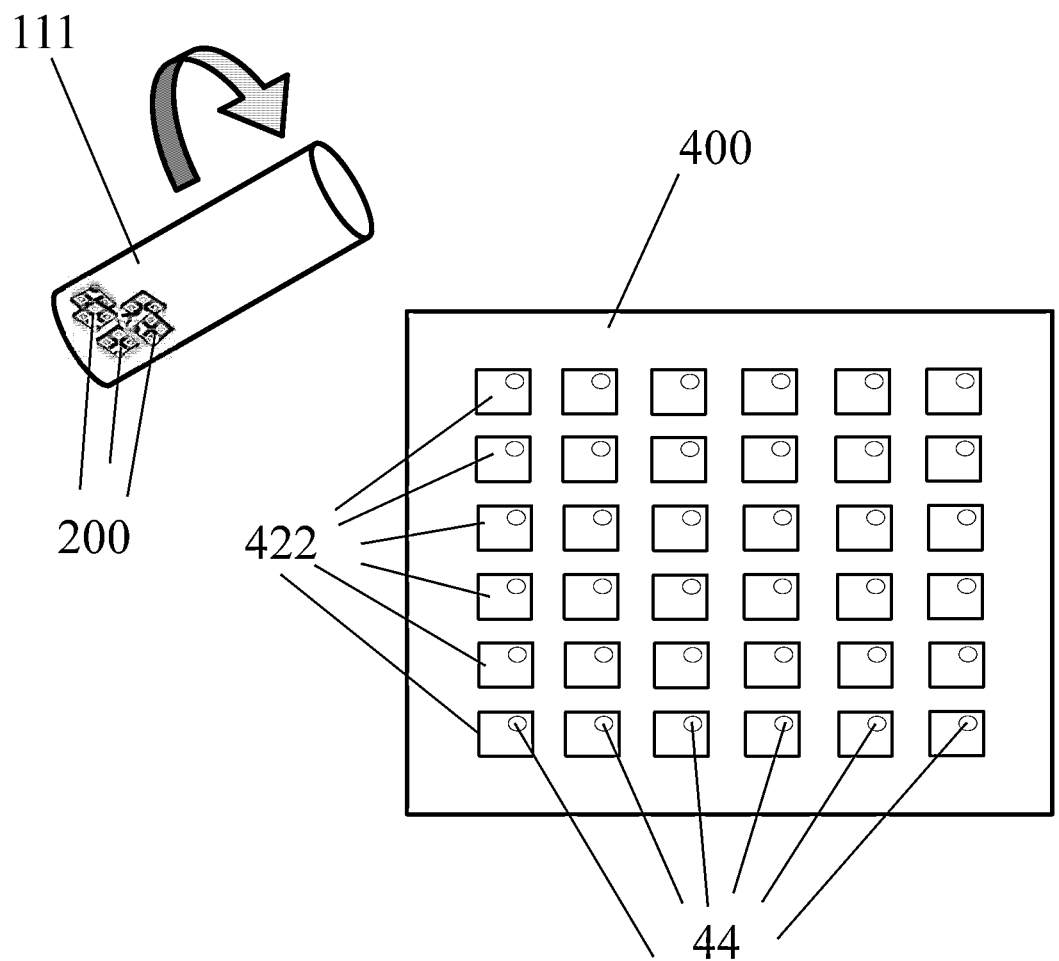
FIG. 11 shows a schematic diagram of using a roller to roll the plurality of die package structures for better uniformity in accordance with the another embodiment of the present invention.

In addition, in order to control the brightness of the die package structures (for instance, the vertical light emitting diode die package structures) and for better illuminant uniformity, as illustrated in FIG. 11 of the present invention, these die package structures 200 to be transferred can be further placed into a roller 111 first and rolling the plurality of die package structures 200 to make their brightness much more uniform. Subsequently, the plurality of die package structures 200 after uniformity can be sprayed onto the vibration base 400 for alignments.

As a result, based on the above-mentioned technical contents provided by Applicants of the present invention, it is obvious that the present invention is aimed to disclose a bonding and transferring method for die package structures. According to the disclosed process method, the transfer procedure can be performed at the die-package level. Since the prior arts can only transfer a single die or wafer at one time, and the encapsulation and wiring process must be carried out additionally after the transfer is complete, the present invention is thus proposed to solve these deficiencies and is able to directly transfer the entire die package structure. Therefore, it is believed that the conventional process cost, complicated procedures, and process complexity are significantly reduced owing to the proposed method disclosed by the present invention.

Apart from the above, according to the bonding and transferring method for die package structures of the present invention, a rapid and mass-transfer result may also be accomplished when a plurality of die package structure is further sprayed and dispensed in large quantities at one time.

Therefore, it is believed that the present invention not only meets up with the requirement for rapidly mass transferring the current LED die structures, but also effectively enhance its competitiveness regarding industrial production. Under such circumstances, the present invention not only results in effectively improving the existing deficiencies in the prior arts, but also complies with the requirements for die packaging and mass-transfer process even when the die size is getting microminiaturization nowadays. In addition, the packaging and encapsulation yield of the vertical light emitting diode die structures can be optimized, thereby realizing the superior effect of the present invention.

As a result, to sum up, according to the several embodiments and the technical contents disclosed by the present invention, it is believed that the disclosed bonding and transferring method of the present invention is applicable to vertical light emitting diode die package structures, and is beneficial to improve the existing packaging, wiring and mass-transferring process. By adopting such process method, as compared with the current technologies, it is believed that the present invention and process methods being proposed are able to effectively solve the issues existing in the prior arts and to provide much more superior process efficiency. In addition, the proposed process method of the present invention can be applied to not only general light emitting diode dies, but also any various related electronic circuit components in the semiconductor industry, integrated circuit industry, or power electronics industry. In view of all, the Applicants assert that the present invention is instinct, effective and highly competitive for incoming technologies, industries and researches developed in the future. And since the technical features, means and effects achieved by the present invention are significantly different from the current solutions, and can not be accomplished easily by those who are familiar with the industry, it is thus believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A bonding and transferring method for die package structures, comprising:
    providing a die package structure, and disposing a positioning adhesive on the die package structure;
    providing a vibration base, which includes at least one cavity corresponding to the positioning adhesive such that the cavity accommodates the positioning adhesive;
    spraying the die package structure and vibrating the vibration base, such that the die package structure is disposed into the vibration base due to an alignment of the positioning adhesive and the cavity;
    providing a target substrate which includes a plurality of drill hole, wherein the plurality of drill hole is filled with a first metal material and a second metal material is further provided to coat on an upper surface of the plurality of drill hole;
    using the second metal material to bond the target substrate with the vibration base having the die package structure thereon;
    performing a laser process to melt the second metal material, such that the target substrate and the die package structure are jointly bonded; and
    removing the vibration base and performing an adhesive removal process such that the positioning adhesive is removed, and the die package structure is bonded and transferred onto the target substrate.

2. The bonding and transferring method for die package structures of claim 1, wherein the positioning adhesive is made of UV curable water glue.

3. The bonding and transferring method for die package structures of claim 2, wherein the adhesive removal process is performed by using a deionized water to hydrolyze the UV curable water glue, such that the positioning adhesive is removed.

4. The bonding and transferring method for die package structures of claim 3, wherein a process time of the adhesive removal process is between 20 minutes and 40 minutes.

5. The bonding and transferring method for die package structures of claim 3, wherein a process temperature of the adhesive removal process is between 60° C. and 90° C.

6. The bonding and transferring method for die package structures of claim 1, wherein the first metal material is copper, and the first metal material is filled in the plurality of drill hole through a screen printing process or an electroplating process.

7. The bonding and transferring method for die package structures of claim 1, wherein the second metal material is tin, and the second metal material is coated on the upper surface of the plurality of drill hole through a screen printing process or a jet printing process.

8. The bonding and transferring method for die package structures of claim 1, wherein the target substrate is a substrate made of glass.

9. The bonding and transferring method for die package structures of claim 1, wherein a hole diameter of one of the plurality of drill hole is at least 60 µm.

10. The bonding and transferring method for die package structures of claim 1, wherein in the step of disposing the positioning adhesive further comprises: coating a magnetic material on an outer region of the positioning adhesive, and the cavity corresponding to the positioning adhesive is a magnetic cavity, such that the alignment of the positioning adhesive and the cavity is made by magnetic attraction between the magnetic material and the magnetic cavity.

11. The bonding and transferring method for die package structures of claim 10, wherein the magnetic material is made of magnetic powder resin.

12. The bonding and transferring method for die package structures of claim 1, wherein the vibration base further includes a plurality of the cavity, such that a plurality of the die package structure is bonded and mass-transferred onto the target substrate by using the vibration base having the plurality of the cavity.

13. The bonding and transferring method for die package structures of claim 12, wherein in the step of spraying the plurality of the die package structure further comprises: placing the plurality of the die package structure into a roller and rolling the plurality of the die package structure for uniformity.

14. The bonding and transferring method for die package structures of claim 1, wherein the die package structure is a package structure of a vertical light emitting diode die.

15. The bonding and transferring method for die package structures of claim 14, wherein the vertical light emitting diode die is selected from a group consisting of a red light emitting diode die, a blue light emitting diode die and a green light emitting diode die.

* * * * *